(12) United States Patent
Su et al.

(10) Patent No.: US 9,484,983 B2
(45) Date of Patent: Nov. 1, 2016

(54) IMPEDANCE ADJUSTMENT METHOD, DELAY CAPACITANCE ADJUSTMENT METHOD AND ASSOCIATED APPARATUS FOR COMMUNICATION DEVICE

(71) Applicant: Realtek Semiconductor Corp., HsinChu (TW)

(72) Inventors: Ching-Yao Su, Taichung (TW); Liang-Wei Huang, Hsinchu (TW); Shih-Wei Wang, Pingtung County (TW); Hsuan-Ting Ho, Taichung (TW)

(73) Assignee: Realtek Semiconductor Corp., HsinChu (TW)

( * ) Notice: Subject to any disclaimer, the term of this patent is extended or adjusted under 35 U.S.C. 154(b) by 141 days.

(21) Appl. No.: 14/327,576

(22) Filed: Jul. 10, 2014

(65) Prior Publication Data
US 2015/0049656 A1 Feb. 19, 2015

(30) Foreign Application Priority Data
Aug. 15, 2013 (TW) .............................. 102129309 A

(51) Int. Cl.
*H04B 3/20* (2006.01)
*H03H 7/40* (2006.01)

(52) U.S. Cl.
CPC . *H04B 3/20* (2013.01); *H03H 7/40* (2013.01)

(58) Field of Classification Search
CPC . H04B 3/00; H04B 3/16; H04B 3/20–3/238; H03H 5/00; H03H 5/003; H03H 5/006; H03H 7/00; H03H 7/01–7/0138; H03H 7/18; H03H 7/185; H03H 7/383–7/425; H04L 25/03885; H04L 5/1423; H04L 25/0276; H04L 27/01
See application file for complete search history.

(56) References Cited

U.S. PATENT DOCUMENTS

| | | | |
|---|---|---|---|
| 2010/0165895 A1* | 7/2010 | Elahi ..................... | H04L 5/1423 370/290 |
| 2011/0243254 A1* | 10/2011 | Pischl ................. | H04L 25/0276 375/257 |
| 2014/0071015 A1* | 3/2014 | Zheng ................ | A61N 1/37252 343/860 |

FOREIGN PATENT DOCUMENTS

WO 2012099774 A1 7/2012

* cited by examiner

*Primary Examiner* — Michael Thier
*Assistant Examiner* — Prince A Mensah
(74) *Attorney, Agent, or Firm* — Winston Hsu; Scott Margo

(57) ABSTRACT

An impedance adjustment method for a communication device, wherein the communication device has a plurality of impedance paths for selection, includes: selecting an initial impedance path; and utilizing a predetermined algorithm to examine a portion of the plurality of impedance paths by starting from the initial impedance path for selecting an optimized impedance path for the communication device. A delay capacitance adjustment method for a communication device, wherein the communication device has a plurality of delay capacitance paths for selection, includes: selecting an initial delay capacitance path; and utilizing a predetermined algorithm to examine a portion of the plurality of delay capacitance paths by starting from the initial delay capacitance path for selecting an optimized delay capacitance path of the communication device.

28 Claims, 7 Drawing Sheets

IMPEDANCE ADJUSTMENT METHOD, DELAY CAPACITANCE ADJUSTMENT METHOD AND ASSOCIATED APPARATUS FOR COMMUNICATION DEVICE

BACKGROUND OF THE INVENTION

1. Field of the Invention

The disclosed embodiments of the present invention relate to impedance adjustment and delay capacitance adjustment, and more particularly, to an impedance adjustment method and a delay capacitance adjustment method utilizing a predetermined algorithm, and associated apparatus.

2. Description of the Prior Art

Differential impedance of a cable may differ from target impedance due to manufacturing processes, environmental factors or aging. This causes impedance mismatches to emerge between the chip and the cable, which could introduce reflection of transmission data (i.e. echo), affecting the reception in the full duplex mode. In the prior art, an impedance adjustment function is employed to deal with the issue. Different impedance paths may be prepared in advance for selection, wherein all impedance paths may be tested under various situations—for example, when a link sequence is restarted after disconnection—to find out the most appropriate.

Echo cancellers are also popular in the prior art. The echo canceller includes a delay capacitance, which may also vary due to changes in environment. Different delay capacitance paths may be prepared in advance for selection, wherein all delay capacitance paths may be tested under various situations—for example, when a link sequence is restarted after disconnection—to find out the most appropriate.

These exhaustive prior art search methods need to test all built-in impedance paths and delay capacitance paths, which is time consuming and makes it difficult to realize fast connection in applications such as Automotive Ethernet. How to obtain the optimized selection of impedance paths and delay capacitance paths has therefore become an urgent issue in the field.

SUMMARY OF THE INVENTION

One of the objectives of the present invention is therefore to provide an impedance adjustment method and a delay capacitance adjustment method utilizing a predetermined algorithm, and associated apparatus, to solve the above mentioned issues.

According to a first aspect of the present invention, an impedance adjustment method for a communication device is disclosed, wherein the communication device has a plurality of impedance paths for selection. The impedance adjustment method comprises: selecting an initial impedance path; and utilizing a predetermined algorithm to examine a portion of the plurality of impedance paths by starting from the initial impedance path for selecting an optimized impedance path for the communication device.

According to a second aspect of the present invention, a delay capacitance adjustment method for a communication device is disclosed, wherein the communication device has a plurality of delay capacitance paths for selection. The delay capacitance adjustment method comprises: selecting an initial delay capacitance path; and utilizing a predetermined algorithm to examine a portion of the plurality of delay capacitance paths by starting from the initial delay capacitance path for selecting an optimized delay capacitance path of the communication device.

According to a third aspect of the present invention, an impedance adjustment apparatus for a communication device is disclosed, wherein the communication device has a plurality of impedance paths for selection. The impedance adjustment apparatus comprises an initial selection unit and an optimized impedance path generation unit. The initial selection unit is arranged to select an initial impedance path. The optimized impedance path generation unit is arranged to utilize a predetermined algorithm to examine a portion of the plurality of impedance paths by starting from the initial impedance path for selecting an optimized impedance path for the communication device.

According to a fourth aspect of the present invention, a delay capacitance adjustment apparatus for a communication device is disclosed, wherein the communication device has a plurality of delay capacitance paths for selection. The delay capacitance adjustment apparatus comprises an initial selection unit and an optimized delay capacitance path generation unit. The initial selection unit is arranged to select an initial delay capacitance path. The optimized delay capacitance path generation unit is arranged to utilize a predetermined algorithm to examine a portion of the plurality of delay capacitance paths by starting from the initial delay capacitance path for selecting an optimized delay capacitance path for the communication device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is coupled to another device, that connection may be through a direct electrical connection, or through an indirect electrical connection via other devices and connections.

Figure 1:
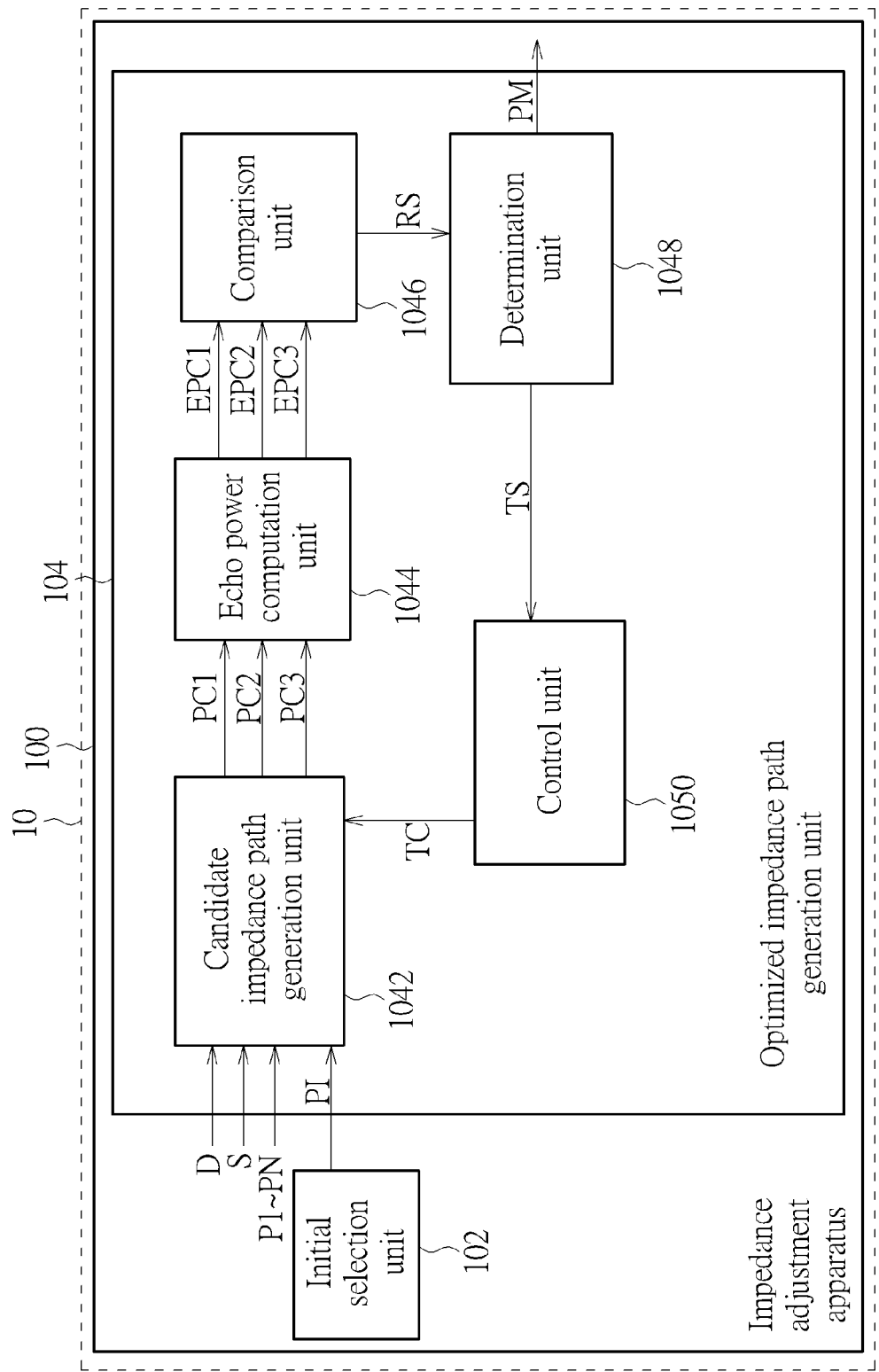
FIG. 1 is a diagram illustrating an impedance adjustment apparatus for a communication device according to an embodiment of the present invention.

FIG. 1 is a diagram illustrating an impedance adjustment apparatus 100 for a communication device according to an embodiment of the present invention. The communication device 10 is located in an Automotive Ethernet system (i.e. the communication device 10 is a component of the Automotive Ethernet) and provides the Automotive Ethernet system with an impedance adjustment method to reduce the echo reflected via the transmission channel and meet the speed acquirement of the Automotive Ethernet system when a connection is created. Compared with the conventional exhaustive search, the proposed method is faster, and accuracy of the method can be adjusted. The invention is not limited to the Automotive Ethernet system.

The impedance adjustment apparatus 100 includes an initial selection unit 102 and an optimized impedance path generation unit 104. The communication device 10 has a plurality of impedance paths for selection. For instance, the communication device 10 has N impedance paths P1-PN for selection. The initial selection unit 102 may be used to select an initial impedance path PI from the N impedance paths P1-PN either by selecting a median from the N impedance paths P1-PN according to the ordering, or by referring to the environment (e.g. the type, length or temperature of the cable). The optimized impedance path generation unit 104 utilizes a predetermined algorithm to examine a portion of the N impedance paths P1-PN by starting from the initial impedance path PI for selecting an optimized impedance path PM for the communication device 10. In this embodiment, the predetermined algorithm is a gradient descent method.

Figure 2:
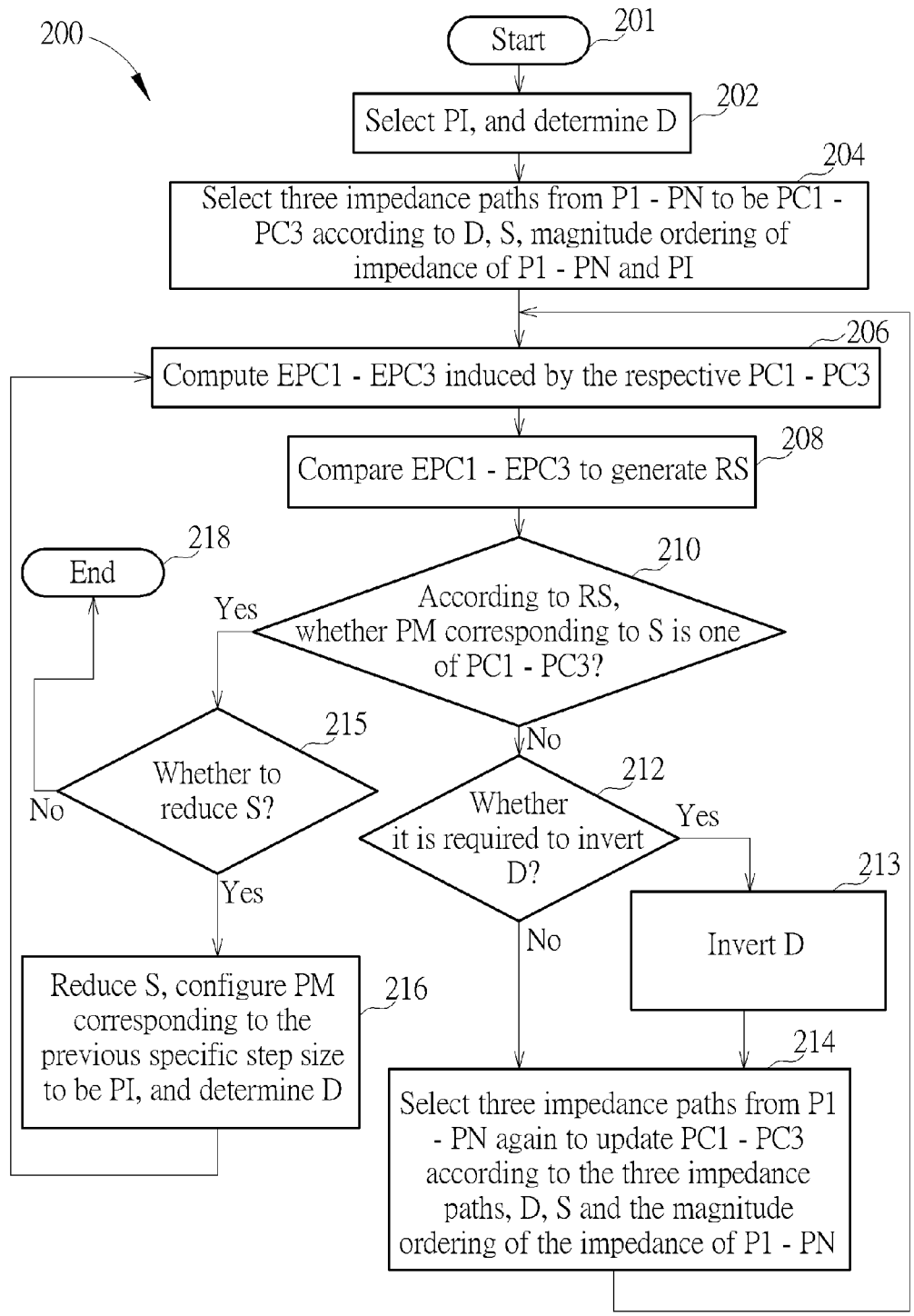
FIG. 2 is a flowchart illustrating an impedance adjustment method for the communication device illustrated in FIG. 1.

FIG. 2 is a flowchart illustrating an impedance adjustment method 200 for the communication device 10 according to an embodiment of the present invention. Provided that substantially the same result is achieved, the steps of the flowchart shown in FIG. 2 need not be in the exact order shown and need not be contiguous; that is, other steps can be intermediate. Some steps in FIG. 2 may be omitted according to various embodiments or requirements. The impedance adjustment method 200 may be briefly summarized as follows.

Step 201: Start;

Step 202: Select an initial impedance path PI, and determine a specific selecting direction D;

Step 204: Select three impedance paths from the N impedance paths P1-PN to be three candidate impedance paths PC1-PC3 according to the specific selecting direction D, a specific step size S, magnitude ordering of impedance of the N impedance paths P1-PN and the initial impedance path PI;

Step: 206: Compute three impedance path echo powers EPC1-EPC3 induced by the respective candidate impedance paths PC1-PC3;

Step: 208: Compare the impedance path echo powers EPC1-EPC3 to generate a comparison result RS;

Step: 210: Determine whether an optimized impedance path PM corresponding to the specific step size S is one of the candidate impedance paths PC1-PC3 according to the comparison result RS;

Step: 212: Determine whether it is required to invert the specific selecting direction D. If yes, go to step 213, else go to step 214;

Step: 213: Invert the specific selecting direction D;

Step: 214: Select three impedance paths from the N impedance paths P1-PN again to update the candidate impedance paths according to the three impedance paths of step 204, the specific selecting direction D, the specific step size S and the magnitude ordering of the impedance of the N impedance paths P1-PN. Go to step 206;

Step 215: Determine whether to reduce the specific step size S. If yes, go to step 216, else go to step 218;

Step 216: Reduce the specific step size S, configure the optimized impedance path PM corresponding to the previous specific step size to be the initial impedance path PI, and determine a specific selecting direction D. Go to step 206; and Step 218: End.

In step 202, the initial selection unit 102 of the impedance adjustment apparatus 100 selects the initial impedance path PI from the N impedance paths P1-PN according to design specification or user requirement and determines the specific selecting direction D. The specific selecting direction D may be selected based on the impedance of the N impedance paths P1-PN and the ranking of the initial impedance path PI. Specifically, when the N impedance paths P1-PN are arranged from left to right based on the size of the impedance, and the initial impedance path PI is positioned to the left of the middle, the specific selecting direction D will be determined to be right; else, when the N impedance paths P1-PN is arranged from left to right based on the size of the impedance, and the initial impedance path PI is positioned to the right of the middle, the specific selecting direction D will be determined to be left.

The optimized impedance path generation unit 104 of the impedance adjustment apparatus 100 includes a candidate impedance path generation unit 1042. In step 204, the candidate impedance path generation unit 1042 selects three impedance paths from the N impedance paths P1-PN to be the candidate impedance paths PC1-PC3 according to the specific selecting direction D, the specific step size S, magnitude ordering of impedance of the N impedance paths P1-PN and the initial impedance path PI obtained from the initial selection unit 102. In other words, in addition to employing the initial impedance path PI, two other impedance paths selected from the N impedance paths P1-PN are considered. The three impedance paths are used as the candidate impedance paths PC1-PC3. Specifically, when the N impedance paths P1-PN are arranged from left to right based on the size of the impedance, the specific selecting direction D>0, the initial impedance path PI is the impedance path P6 and the specific step size S=2, the impedance paths P6, P8, P10 will be configured to be the candidate impedance paths PC1-PC3. In another case, where the specific selecting direction D<0, the initial impedance path PI is the impedance path P12 and the specific step size S=1, the impedance paths P12, P11, P10 are therefore configured to be the candidate impedance paths PC1-PC3

The selection of the specific step size S may be based on the desired search speed and accuracy. Specifically, the larger the specific step size S, the lower the resolution of the searching performed upon the N impedance paths P1-PN. The lower the searching resolution, the faster (but less ideal) the speed of the searching operation. The smaller the specific step size S, the higher the resolution of the searching performed upon the N impedance paths P1-PN. The higher the searching resolution, the slower (but more ideal) the searching operation.

In one embodiment, a larger first specific step (S=S1) is employed to preliminarily generate the optimized impedance path PM, then a smaller second specific step (S=S2) is employed to generate the optimized impedance path PM. In other words, a gradient descent method with a larger step size is performed upon the impedance adjustment apparatus 100 for coarse-tuning, and the same gradient descent method with a smaller step size is performed upon the impedance adjustment apparatus 100 for fine-tuning.

It should be noted that the above embodiment regarding selecting the candidate impedance paths PC1-PC3, the specific selecting direction D and the specific step size S is for illustrative purposes only and is not a limitation of the invention. In practice, depending on design considerations or user requests, the number of candidate impedance paths may not be 3, and the method for selecting the specific selecting direction D and the specific step size S may be modified. The optimized impedance path generation unit 104 of the impedance adjustment apparatus 100 includes an echo power computation unit 1044. In step 206, the echo power computation unit 1044 computes three impedance path echo powers EPC1-EPC3 induced by the respective three candidate impedance paths PC1-PC3. Computation of the impedance path echo powers EPC1-EPC3 may be based on conventional methods.

Figure 3:
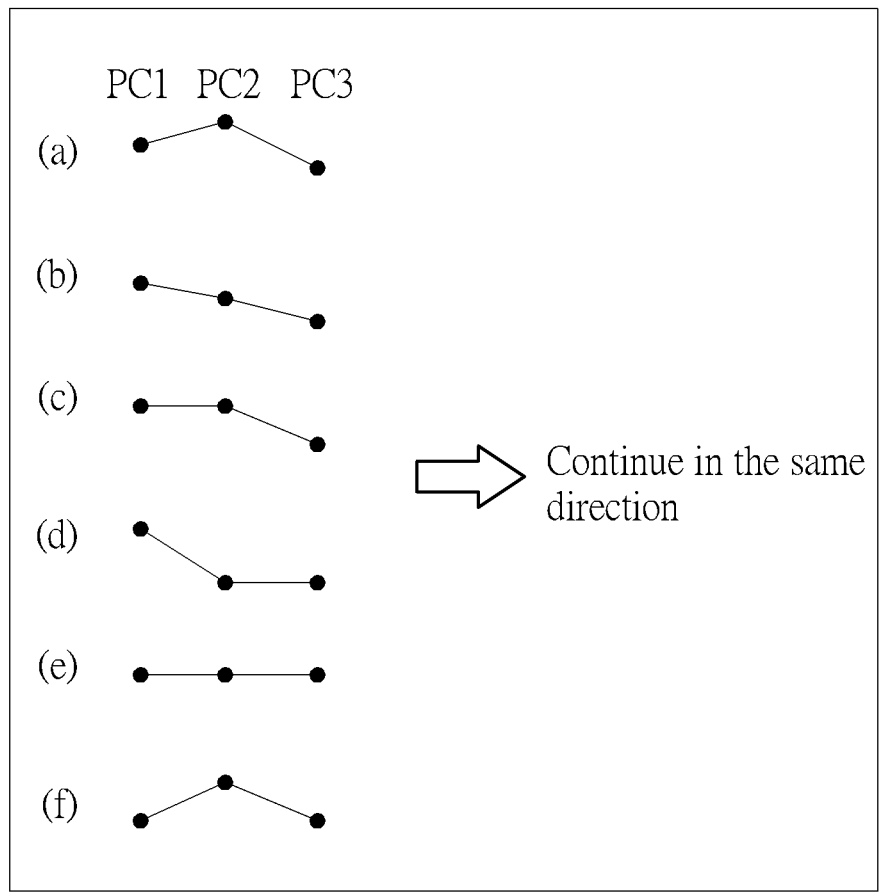
FIGS. 3-5 are diagrams illustrating determination of the optimized impedance path according to an embodiment of the present invention.
Figure 4:
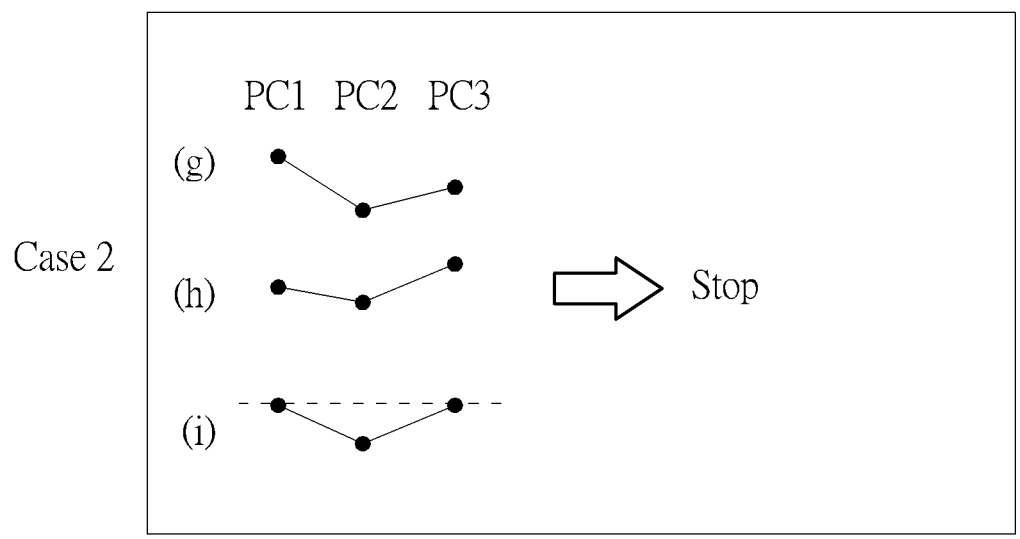
Figure 5:
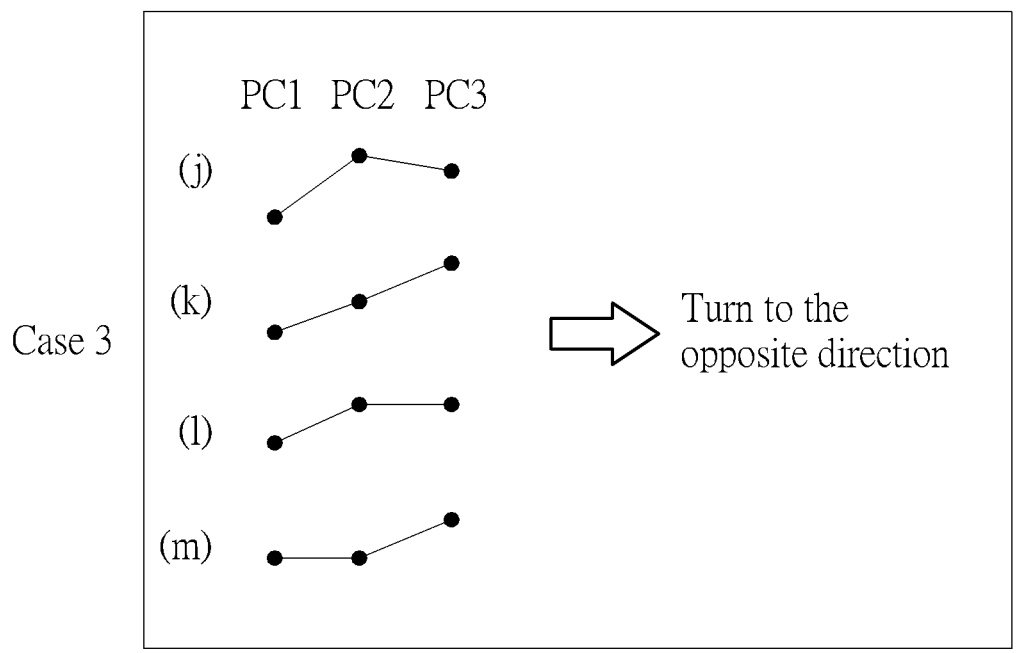

After the impedance path echo powers EPC1-EPC3 are obtained, the flow proceeds to step 208. A comparison unit 1046 of the optimized impedance path generation unit 104 of the impedance adjustment apparatus 100 compares the impedance path echo powers EPC1-EPC3 to generate a first comparison result RS. In step 210, a determination unit 1048 of the optimized impedance path generation unit 104 of the impedance adjustment apparatus 100 determines whether an optimized impedance path PM corresponding to the specific step size S is one of the candidate impedance paths PC1-PC3 according to the comparison result RS. FIGS. 3-5 explain the specific operation of the determination unit 1048.

FIGS. 3-5 are diagrams illustrating determination of the optimized impedance path according to an embodiment of the present invention. Please note that the three black dots depicted in respective cases (a)-(m) mentioned in FIGS. 3-5 stand for the three candidate impedance paths PC1-PC3. The position relationship indicates the magnitude relationship of the impedance path echo powers EPC1-EPC3. The higher the horizontal position, the larger the impedance path echo power induced by the impedance path. The lower the horizontal position, the smaller the impedance path echo power induced by the impedance path. Taking the case (a) of FIG. 3 as an example, the candidate impedance path PC2 possesses the largest impedance path echo power, and the candidate impedance path PC3 possesses the smallest impedance path echo power. The optimized impedance path PM may be located outside the range of the candidate impedance paths PC1-PC3 according to the gradient descent method. As a result, the determination unit 1048 cannot yet make a decision of the optimized impedance path PM; but the information indicates that the specific selecting direction D should be towards the right to reduce the impedance path echo power. In other words, the optimized impedance path PM can be found close to the right. The determination unit 1048 therefore transmits a control signal TS to notify the control unit 1050 to keep searching towards the specific selecting direction D. Similarly, in cases (b)-(f) illustrated in FIG. 3, the determination unit 1048 transmits a control signal TS to notify the control unit 1050 to keep searching in the specific selecting direction D.

Taking the case (g) of FIG. 4 as an example, the candidate impedance path PC1 possesses the largest impedance path echo power, and the candidate impedance path PC2 possesses the smallest impedance path echo power. The optimized impedance path PM may be located in the range of the candidate impedance paths PC1-PC3 according to the gradient descent method (special cases such as local minimum are not considered here). The candidate impedance path PC2 may therefore be selected to be the optimized impedance path PM. As a result, the determination unit 1048 can make a decision of the optimized impedance path PM and the searching can be halted. The determination unit 1048 therefore transmits a control signal TS to notify the control unit 1050 that the optimized impedance path PM has been found. Similarly, in cases (h)-(i) of FIG. 4, the determination unit 1048 transmits a control signal TS to notify the control unit 1050 that the optimized impedance path PM has been found.

Taking case (j) of FIG. 5 as an example, the candidate impedance path PC2 possesses the largest impedance path echo power, and the candidate impedance path PC1 possesses the smallest impedance path echo power. Similar to the cases in FIG. 3, the optimized impedance path PM may be located outside the range of the candidate impedance paths PC1-PC3 according to the gradient descent method (special cases such as local minimum are not considered here). As a result, the determination unit 1048 cannot yet make a decision of the optimized impedance path PM; but the information indicates that the specific selecting direction D should be towards the left to reduce the impedance path echo power. In other words, the optimized impedance path PM can be found close to the left. The determination unit 1048 therefore transmits a control signal TS to notify the control unit 1050 to change the specific selecting direction D to the left and then keep searching. Similarly, in cases (k)-(m) of FIG. 5, the determination unit 1048 transmits a control signal TS to notify the control unit 1050 to change the specific selecting direction D to the left and then keep searching.

In step 210, if the determination unit 1048 asserts that optimized impedance path PM corresponding to the specific step size S is one of the candidate impedance paths PC1-PC3, the flow proceeds to step 215 and the searching process with respect to the specific step size S (e.g. S=S1) terminates. Else, if the determination unit 1048 cannot assert that optimized impedance path PM corresponding to the specific step size S is one of the candidate impedance paths PC1-PC3, the flow proceeds to step 212. In step 212, the control unit 1051 determines whether to change the direction of the specific selecting direction D by heading to the correct direction to lower the impedance path echo powers. If the determination unit 1048 notifies the control unit 1050 by the control signal TS to turn around the specific selecting direction D, the flow will proceed to step 213 and then step 214 to update the candidate impedance paths. If the determination unit 1048 notifies the control unit 1050 by the control signal TS to keep using the current specific selecting direction D, the flow will proceed to step 214 to update the candidate impedance paths.

In step 214, the control unit 105 residing in the optimized impedance path generation unit 104 of the impedance adjustment apparatus 100 selects three impedance paths from the N impedance paths P1-PN again to update the candidate impedance paths according to the three impedance paths (i.e. the currently selected candidate impedance paths PC1-PC3), the specific selecting direction D, the specific step size S and the magnitude ordering of the impedance of the N impedance paths P1-PN. The flow then proceeds to step 206 for the furthering gradient descent operation until the optimized impedance path PM corresponding to the specific step size S is found.

If the determination unit 1048 notifies the control unit 1050 to keep searching towards the current specific selecting direction D, where D>0, the specific step size S=2 and the current candidate impedance paths PC1-PC3 are P4, P6, P8, the control unit 1050 will transmit a control signal TC to the candidate impedance path generation unit 1042, to control the candidate impedance path generation unit 1042 to configure the following candidate impedance paths PC1-PC3 as P6, P8 and P10. In another example, if the current specific selecting direction D>0, the determination unit 1048 will notify the control unit 1050 to turn around, i.e. to head to the opposite direction of the current specific selecting direction D, and configure the specific step size S to be 3. Since the current candidate impedance paths PC1-PC3 are P5, P8 and P11, the control unit 1050 will transmit a control signal TC to the candidate impedance path generation unit 1042 to configure the following candidate impedance paths to be P8, P5 and P2.

In addition, to avoid a dead lock situation, flags may be employed to allow the impedance adjustment apparatus 100 to reset in some special cases. After obtaining the optimized impedance path PM corresponding to a first specific step S1 (i.e. the optimized impedance path corresponding to the larger step), the optimized impedance path PM corresponding to a second specific step S2 (i.e. the optimized impedance path corresponding to the smaller step) will be found subsequently based on the previously found PM, i.e. steps 216, 206, 208 and 210. After the optimized impedance path PM corresponding to the second specific step S2 is found, the searching operation will be terminated in step 215 and the flow ends. Specifically, the first specific step S1 is 3 and the second specific step S2 is 1 in an embodiment.

Please note that the two-stage gradient descent method with a preliminary coarse-tuning and a final fine-tuning is for illustrative purposes only, and modifications can be made according to user requirements based on environment and specification. For instance, in a system with a relaxed bit-error-rate (BER) requirement, it is feasible to only adopt the coarse-tuning with the first specific step S1. The flow therefore terminates after the optimized impedance path PM corresponding to the first specific step S1 is found.

In summary, the impedance path echo powers EPC1-EPC3 corresponding to the respective N impedance paths P1-PN, which are arranged according to impedance, appear as a convex function. One of the N impedance paths P1-PN corresponds to an impedance path echo power which is a minimum among the impedance path echo powers EPC1-EPC3. If the one impedance path is not P1 or PN, then the impedance path echo powers EPC1-EPC3 corresponding to the N impedance paths P1-PN will appear in a convex arrangement. In the convex arrangement, the closer the impedance path echo power is to both ends, the larger the value. Hence, two impedance paths around the initial impedance path and the initial impedance path are referenced at first to make a decision as to the searching direction towards the lowest point of the convex function. The lowest point can be determined when the sign of the gradient changes, meaning the lowest point has just been passed. Generally speaking, if the initial impedance path resides at the left side of the lowest point of the impedance path echo powers, most of the computations regarding the right side of the lowest point of the impedance path echo powers can be saved.

Figure 6:
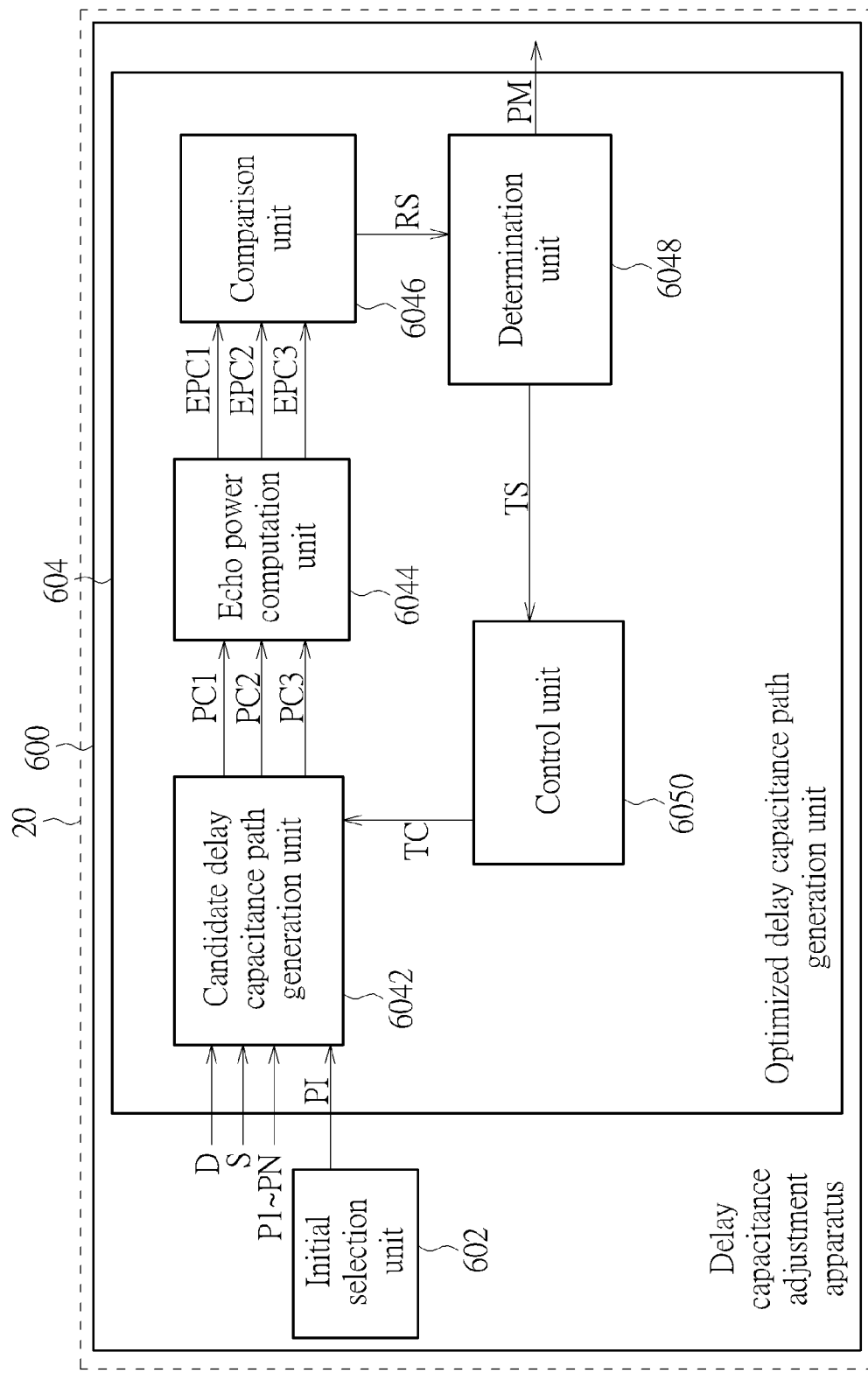
FIG. 6 is a diagram illustrating a delay capacitance adjustment apparatus for a communication device according to an embodiment of the present invention.

FIG. 6 is a diagram illustrating a delay capacitance adjustment apparatus 600 for a communication device according to an embodiment of the present invention. The communication device 20 is located in an Automotive Ethernet system (i.e. the communication device 20 is a component of the Automotive Ethernet) and provides the Automotive Ethernet system with a delay capacitance adjustment method to reduce the echo reflected via the transmission channel and meet the speed acquirement of the Automotive Ethernet system when a connection is created. Compared with the conventional exhaustive search, the proposed method is faster, and accuracy of the method can be adjusted. The invention is not limited to the Automotive Ethernet system.

The delay capacitance adjustment apparatus 600 includes an initial selection unit 602 and an optimized delay capacitance path generation unit 604. The communication device 20 has a plurality of delay capacitance paths for selection. For instance, the communication device 20 has N delay capacitance paths P1-PN for selection. The initial selection unit 102 may be used to select an initial delay capacitance path PI from the N delay capacitance paths P1-PN either by selecting a median from the N delay capacitance paths P1-PN according to the order, or by referring to the environment (e.g. the type, length or temperature of the cable). The optimized delay capacitance path generation unit 604 includes a candidate delay capacitance path generation unit 6042, an echo power computation unit 6044, a comparison unit 6046, a determination unit 6048 and a control unit 6050. The optimized delay capacitance path generation unit 604 is used to utilize a predetermined algorithm to examine a portion of the N delay capacitance paths P1-PN by starting from the initial delay capacitance path PI for selecting an optimized delay capacitance path PM for the communication device 20. In this embodiment, the predetermined algorithm is a gradient descent method.

Figure 7:
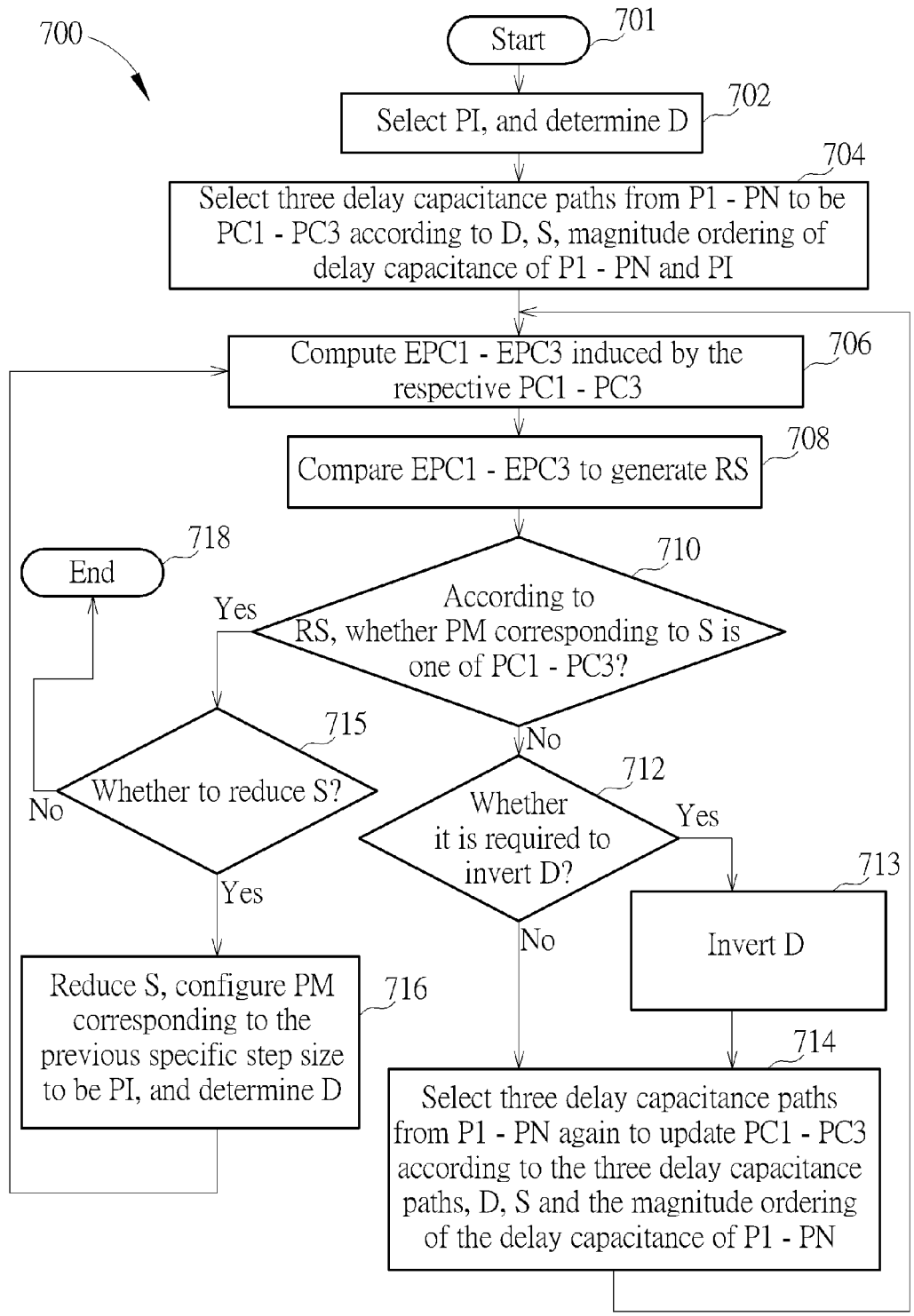
FIG. 7 is a flowchart illustrating a delay capacitance adjustment method for the communication device illustrated in FIG. 6.

FIG. 7 is a flowchart illustrating a delay capacitance adjustment method 700 for the communication device 20 according to an embodiment of the present invention. Provided that substantially the same result is achieved, the steps of the flowchart shown in FIG. 7 need not be in the exact order shown and need not be contiguous; that is, other steps can be intermediate. Some steps in FIG. 7 may be omitted according to various embodiments or requirements. The delay capacitance adjustment method 700 may be briefly summarized as follows.

Step 701: Start;

Step 702: Select an initial delay capacitance path PI, and determine a specific selecting direction D;

Step 704: Select three delay capacitance paths from the N delay capacitance paths P1-PN to be three candidate delay capacitance paths PC1-PC3 according to the specific selecting direction D, a specific step size S, magnitude ordering of delay capacitance of the N delay capacitance paths P1-PN and the initial delay capacitance path PI;

Step: 706: Compute three delay capacitance path echo powers EPC1-EPC3 induced by the respective candidate delay capacitance paths PC1-PC3;

Step: 708: Compare the delay capacitance path echo powers EPC1-EPC3 to generate a comparison result RS;

Step: 710: Determine whether an optimized delay capacitance path PM corresponding to the specific step size S is one of the candidate delay capacitance paths PC1-PC3 according to the comparison result RS;

Step: 712: Determine whether it is required to invert the specific selecting direction D. If yes, go to step 713, else go to step 714;

Step: 713: Invert the specific selecting direction D;

Step: 714: Select three delay capacitance paths from the N delay capacitance paths P1-PN again to update the candidate delay capacitance paths according to the three delay capacitance paths of step 704, the specific selecting direction D, the specific step size S and the magnitude ordering of the delay capacitance of the N delay capacitance paths P1-PN. Go to step 706;

Step 715: Determine whether to reduce the specific step size S. If yes, go to step 716, else go to step 718;

Step 716: Reduce the specific step size S, configure the optimized delay capacitance path PM corresponding to the previous specific step size to be the initial delay capacitance path PI, and determine a specific selecting direction D. Go to step 706; and Step 718: End.

The concept of the delay capacitance adjustment method 700 is the same as that of the impedance adjustment method 200. The main difference between the delay capacitance adjustment method 700 and the impedance adjustment method 200 is the target of adjustment. The steps of the delay capacitance adjustment method 700 can be readily understood by referring to the above paragraphs.

In summary, the delay capacitance path echo powers EPC1-EPC3 corresponding to the respective N delay capacitance paths P1-PN, which are arranged according to delay capacitance, appear as a convex function. One of the N delay capacitance paths P1-PN corresponds to a delay capacitance path echo power which is a minimum among the delay capacitance path echo powers EPC1-EPC3. If the one delay capacitance path is not P1 or PN, then the delay capacitance path echo powers EPC1-EPC3 corresponding to the N delay capacitance paths P1-PN will appear as a convex arrangement. In the convex arrangement, the closer the delay capacitance path echo power is to both ends, the larger the value. Hence, two delay capacitance paths around the initial delay capacitance path and the initial delay capacitance path are referenced at first to make a decision as to the searching direction towards the lowest point of the concave function. The lowest point can be determined when the sign of the gradient changes, meaning the lowest point has just been passed. Generally speaking, if the initial delay capacitance path resides at the left side of the lowest point of the delay capacitance path echo powers, most of the computations regarding the right side of the lowest point of the delay capacitance path echo powers can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An impedance adjustment method for a communication device, wherein the communication device has a plurality of impedance paths for selection, the method comprising:

selecting an initial impedance path; and utilizing an optimized impedance path generation unit within the communication device to use a predetermined algorithm to examine a portion of the plurality of impedance paths by starting from the initial impedance path for selecting an optimized impedance path for the communication device;

wherein the predetermined algorithm is a gradient descent method, and the step of utilizing the predetermined algorithm to examine the portion of the plurality of impedance paths by starting from the initial impedance path for selecting the optimized impedance path for the communication device comprises:

selecting a plurality of first impedance paths from the plurality of impedance paths to be a plurality of first candidate impedance paths according to a first specific selecting direction, a first specific step size, magnitude ordering of impedance of the plurality of impedance paths and the initial impedance path;

computing a plurality of first impedance path echo powers induced by the respective plurality of first candidate impedance paths;

comparing the plurality of first impedance path echo powers to generate a first comparison result; and determining whether an optimized impedance path corresponding to the first specific step size is one of the plurality of first candidate impedance paths according to the first comparison result;

wherein the optimized impedance path of the communication device is determined according to the optimized impedance path corresponding to the first specific step size.

2. The impedance adjustment method of claim 1, wherein the communication device is located in an Automotive Ethernet system.

3. The impedance adjustment method of claim 1, wherein the step of utilizing the predetermined algorithm to examine the portion of the plurality of impedance paths by starting from the initial impedance path for selecting the optimized impedance path for the communication device further comprises:

when the first comparison result indicates that the optimized impedance path corresponding to the first specific step size does not exist within the plurality of first candidate impedance paths, selecting a plurality of second impedance paths from the plurality of impedance paths to update the plurality of first candidate impedance paths according to the plurality of first impedance paths, the first specific selecting direction, the first specific step size and the magnitude ordering of the impedance of the plurality of impedance paths.

4. The impedance adjustment method of claim 1, wherein the step of determining whether the optimized impedance path corresponding to the first specific step size is one of the plurality of first candidate impedance paths according to the first comparison result comprises:

when the first comparison result indicates that a minimum impedance path echo power of the plurality of first impedance paths echo powers does not correspond to a first candidate impedance path having the maximum or minimum impedance compared to the rest of the plurality of first candidate impedance paths, determining a first candidate impedance path of the plurality of first candidate impedance paths corresponding to the minimum impedance path echo power to be the optimized impedance path corresponding to the first specific step size.

5. The impedance adjustment method of claim 1, wherein the step of utilizing the predetermined algorithm to examine the portion of the plurality of impedance paths by starting from the initial impedance path for selecting the optimized impedance path for the communication device further comprises:

selecting a plurality of second impedance paths from the plurality of impedance paths to be a plurality of second candidate impedance paths according to a second specific selecting direction, a second specific step size, magnitude ordering of impedance of the plurality of impedance paths and the optimized impedance path corresponding to the first specific step size, wherein the second specific step size is smaller than the first specific step size, and the second specific selecting direction is the same as the first specific selecting direction or different from the first specific selecting direction;

computing a plurality of second impedance path echo powers induced by the respective plurality of second candidate impedance paths;

comparing the plurality of second impedance path echo powers to generate a second comparison result; and determining whether an optimized impedance path corresponding to the second specific step size is one of the plurality of second candidate impedance paths according to the second comparison result;

wherein the optimized impedance path of the communication device is determined according to the optimized impedance path corresponding to the second specific step size.

6. The impedance adjustment method of claim 5, wherein the step of utilizing the predetermined algorithm to examine the portion of the plurality of impedance paths by starting from the initial impedance path for selecting the optimized impedance path for the communication device further comprises:

when the second comparison result indicates that the optimized impedance path corresponding to the second specific step size does not exist within the plurality of second candidate impedance paths, selecting a plurality of third impedance paths from the plurality of impedance paths to update the plurality of second candidate impedance paths according to the plurality of second impedance paths, the second specific selecting direction, the second specific step size and the magnitude ordering of the impedance of the plurality of impedance paths.

7. The impedance adjustment method of claim 5, wherein the step of determining whether the optimized impedance path corresponding to the first specific step size is one of the plurality of second candidate impedance paths according to the second comparison result comprises:

when the second comparison result indicates that a minimum impedance path echo power of the plurality of second impedance paths echo powers does not correspond to a second candidate impedance path having the maximum or minimum impedance compared to the rest of the plurality of second candidate impedance paths, determining a second candidate impedance path of the plurality of second candidate impedance paths corresponding to the minimum impedance path echo power to be the optimized impedance path corresponding to the second specific step size.

8. A delay capacitance adjustment method for a communication device, wherein the communication device has a plurality of delay capacitance paths for selection, the method comprising:

selecting an initial delay capacitance path; and utilizing an optimized delay capacitance path generation unit within the communication device to use a predetermined algorithm to examine a portion of the plurality of delay capacitance paths by starting from the initial delay capacitance path for selecting an optimized delay capacitance path of the communication device;

wherein the predetermined algorithm is a gradient descent method, and the step of utilizing the predetermined algorithm to examine the portion of the plurality of delay capacitance paths by starting from the initial delay capacitance path for selecting the optimized delay capacitance path for the communication device comprises:

selecting a plurality of first delay capacitance paths from the plurality of delay capacitance paths to be a plurality of first candidate delay capacitance paths according to a first specific selecting direction, a first specific step size, magnitude ordering of delay capacitance of the plurality of delay capacitance paths and the initial delay capacitance path;

computing a plurality of first delay capacitance path echo powers induced by the respective plurality of first candidate delay capacitance paths;

comparing the plurality of first delay capacitance path echo powers to generate a first comparison result; and determining whether an optimized delay capacitance path corresponding to the first specific step size is one of the plurality of first candidate delay capacitance paths according to the first comparison result;

wherein the optimized delay capacitance path of the communication device is determined according to the optimized delay capacitance path corresponding to the first specific step size.

9. The delay capacitance adjustment method of claim 8, wherein the communication device is located in an Automotive Ethernet system.

10. The delay capacitance mismatch adjustment method of claim 8, wherein the step of utilizing the predetermined algorithm to examine the portion of the plurality of delay capacitance paths by starting from the initial delay capacitance path for selecting the optimized delay capacitance path for the communication device further comprises:

when the first comparison result indicates that the optimized delay capacitance path corresponding to the first specific step size does not exist within the plurality of first candidate delay capacitance paths, selecting a plurality of second delay capacitance paths from the plurality of delay capacitance paths to update the plurality of first candidate delay capacitance paths according to the plurality of first delay capacitance paths, the first specific selecting direction, the first specific step size and the magnitude ordering of the delay capacitance of the plurality of delay capacitance paths.

11. The delay capacitance mismatch adjustment method of claim 8, wherein the step of determining whether the optimized delay capacitance path corresponding to the first specific step size is one of the plurality of first candidate delay capacitance paths according to the first comparison result comprises:

when the first comparison result indicates that a minimum delay capacitance path echo power of the plurality of first delay capacitance paths echo powers does not correspond to a first candidate delay capacitance path having the maximum or minimum delay capacitance compared to the rest of the plurality of first candidate delay capacitance paths, determining a first candidate delay capacitance path of the plurality of first candidate delay capacitance paths corresponding to the minimum delay capacitance path echo power to be the optimized delay capacitance path corresponding to the first specific step size.

12. The delay capacitance mismatch adjustment method of claim 8, wherein the step of utilizing the predetermined algorithm to examine the portion of the plurality of delay capacitance paths by starting from the initial delay capacitance path for selecting the optimized delay capacitance path for the communication device further comprises:

selecting a plurality of second delay capacitance paths from the plurality of delay capacitance paths to be a plurality of second candidate delay capacitance paths according to a second specific selecting direction, a second specific step size, magnitude ordering of delay capacitance of the plurality of delay capacitance paths and the optimized delay capacitance path corresponding to the first specific step size, wherein the second specific step size is smaller than the first specific step size, and the second specific selecting direction is the same as the first specific selecting direction or different from the first specific selecting direction;

computing a plurality of second delay capacitance path echo powers induced by the respective plurality of second candidate delay capacitance paths;

comparing the plurality of second delay capacitance path echo powers to generate a second comparison result; and determining whether an optimized delay capacitance path corresponding to the second specific step size is one of the plurality of second candidate delay capacitance paths according to the second comparison result;

wherein the optimized delay capacitance path of the communication device is determined according to the optimized delay capacitance path corresponding to the second specific step size.

13. The delay capacitance mismatch adjustment method of claim 12, wherein the step of utilizing the predetermined algorithm to examine the portion of the plurality of delay capacitance paths by starting from the initial delay capacitance path for selecting the optimized delay capacitance path for the communication device further comprises:

when the second comparison result indicates that the optimized delay capacitance path corresponding to the second specific step size does not exist within the plurality of second candidate delay capacitance paths, selecting a plurality of third delay capacitance paths from the plurality of delay capacitance paths to update the plurality of second candidate delay capacitance paths according to the plurality of second delay capacitance paths, the second specific selecting direction, the second specific step size and the magnitude ordering of the delay capacitance of the plurality of delay capacitance paths.

14. The delay capacitance mismatch adjustment method of claim 12, wherein the step of determining whether the optimized delay capacitance path corresponding to the first specific step size is one of the plurality of second candidate delay capacitance paths according to the second comparison result comprises:

when the second comparison result indicates that a minimum delay capacitance path echo power of the plurality of second delay capacitance paths echo powers does not correspond to a second candidate delay capacitance path having the maximum or minimum delay capacitance compared to the rest of the plurality of second candidate delay capacitance paths, determining a second candidate delay capacitance path of the plurality of second candidate delay capacitance paths corresponding to the minimum delay capacitance path echo power to be the optimized delay capacitance path corresponding to the second specific step size.

15. An impedance adjustment apparatus for a communication device, wherein the communication device has a plurality of impedance paths for selection, and the impedance adjustment apparatus comprises:

an initial selection unit, arranged to select an initial impedance path; and an optimized impedance path generation unit, arranged to utilize a predetermined algorithm to examine a portion of the plurality of impedance paths by starting from the initial impedance path for selecting an optimized impedance path for the communication device;

wherein the predetermined algorithm is a gradient descent method, and the optimized impedance path generation unit comprises:

a candidate impedance path generation unit, arranged to select a plurality of first impedance paths from the plurality of impedance paths to be a plurality of first candidate impedance paths according to a first specific selecting direction, a first specific step size, magnitude ordering of impedance of the plurality of impedance paths and the initial impedance path;

an echo power computation unit, arranged to compute a plurality of first impedance path echo powers induced by the respective plurality of first candidate impedance paths;

a comparison unit, arranged to compare the plurality of first impedance path echo powers to generate a first comparison result; and a determination unit, arranged to determine whether an optimized impedance path corresponding to the first specific step size is one of the plurality of first candidate impedance paths according to the first comparison result;

wherein the optimized impedance path of the communication device is determined according to the optimized impedance path corresponding to the first specific step size.

16. The impedance adjustment apparatus of claim 15, wherein the communication device is located in an Automotive Ethernet system.

17. The impedance adjustment apparatus of claim 15, wherein the optimized impedance path generation unit comprises:

a control unit, wherein when the determination unit indicates that the optimized impedance path corresponding to the first specific step size does not exist within the plurality of first candidate impedance paths, the control unit is arranged to select a plurality of second impedance paths from the plurality of impedance paths to update the plurality of first candidate impedance paths according to the plurality of first impedance paths, the first specific selecting direction, the first specific step size and the magnitude ordering of the impedance of the plurality of impedance paths.

18. The impedance adjustment apparatus of claim 15, wherein when the first comparison result indicates that a minimum impedance path echo power of the plurality of first impedance paths echo powers does not correspond to a first candidate impedance path having the maximum or minimum impedance compared to the rest of the plurality of first candidate impedance paths, the determination unit determines a first candidate impedance path of the plurality of first candidate impedance paths corresponding to the minimum impedance path echo power to be the optimized impedance path corresponding to the first specific step size.

19. The impedance adjustment apparatus of claim 15, wherein the candidate impedance path generation unit further selects a plurality of second impedance paths from the plurality of impedance paths to be a plurality of second candidate impedance paths according to a second specific selecting direction, a second specific step size, magnitude ordering of impedance of the plurality of impedance paths and the optimized impedance path corresponding to the first specific step size, wherein the second specific step size is smaller than the first specific step size, and the second specific selecting direction is the same as the first specific selecting direction or different from the first specific selecting direction; the echo power computation unit further computes a plurality of second impedance path echo powers induced by the respective plurality of second candidate impedance paths; the comparison unit further compares the plurality of second impedance path echo powers to generate a second comparison result; and the determination unit further determines whether an optimized impedance path corresponding to the second specific step size is one of the plurality of second candidate impedance paths according to the second comparison result; wherein the optimized impedance path of the communication device is determined according to the optimized impedance path corresponding to the second specific step size.

20. The impedance adjustment apparatus of claim 19, wherein when the second comparison result indicates that the optimized impedance path corresponding to the second specific step size does not exist within the plurality of second candidate impedance paths, the control unit further selects a plurality of third impedance paths from the plurality of impedance paths to update the plurality of second candidate impedance paths according to the plurality of second impedance paths, the second specific selecting direction, the second specific step size and the magnitude ordering of the impedance of the plurality of impedance paths.

21. The impedance adjustment apparatus of claim 19, wherein when the second comparison result indicates that a minimum impedance path echo power of the plurality of second impedance paths echo powers does not correspond to a second candidate impedance path having the maximum or minimum impedance compared to the rest of the plurality of second candidate impedance paths, the determination unit determines a second candidate impedance path of the plurality of second candidate impedance paths corresponding to the minimum impedance path echo power to be the optimized impedance path corresponding to the second specific step size.

22. A delay capacitance adjustment apparatus for a communication device, wherein the communication device has a plurality of delay capacitance paths for selection, and the delay capacitance adjustment apparatus comprises:
an initial selection unit, arranged to select an initial delay capacitance path; and
an optimized delay capacitance path generation unit, arranged to utilize a predetermined algorithm to examine a portion of the plurality of delay capacitance paths by starting from the initial delay capacitance path for selecting an optimized delay capacitance path for the communication device;
wherein the predetermined algorithm is a gradient descent method, and the optimized delay capacitance path generation unit comprises:
a candidate delay capacitance path generation unit, arranged to select a plurality of first delay capacitance paths from the plurality of delay capacitance paths to be a plurality of first candidate delay capacitance paths according to a first specific selecting direction, a first specific step size, magnitude ordering of delay capacitance of the plurality of delay capacitance paths and the initial delay capacitance path;
an echo power computation unit, arranged to compute a plurality of first delay capacitance path echo powers induced by the respective plurality of first candidate delay capacitance paths;
a comparison unit, arranged to compare the plurality of first delay capacitance path echo powers to generate a first comparison result; and
a determination unit, arranged to determine whether an optimized delay capacitance path corresponding to the first specific step size is one of the plurality of first candidate delay capacitance paths according to the first comparison result;
wherein the optimized delay capacitance path of the communication device is determined according to the optimized delay capacitance path corresponding to the first specific step size.

23. The delay capacitance adjustment apparatus of claim 22, wherein the communication device is located in an Automotive Ethernet system.

24. The delay capacitance adjustment apparatus of claim 22, wherein the optimized delay capacitance path generation unit comprises:
a control unit, when the determination unit indicates that the optimized delay capacitance path corresponding to the first specific step size does not exist within the plurality of first candidate delay capacitance paths, arranged to select a plurality of second delay capacitance paths from the plurality of delay capacitance paths to update the plurality of first candidate delay capacitance paths according to the plurality of first delay capacitance paths, the first specific selecting direction, the first specific step size and the magnitude ordering of the delay capacitance of the plurality of delay capacitance paths.

25. The delay capacitance adjustment apparatus of claim 22, wherein when the first comparison result indicates that a minimum delay capacitance path echo power of the plurality of first delay capacitance paths echo powers does not correspond to a first candidate delay capacitance path having the maximum or minimum delay capacitance compared to the rest of the plurality of first candidate delay capacitance paths, the determination unit determines a first candidate delay capacitance path of the plurality of first candidate delay capacitance paths corresponding to the minimum delay capacitance path echo power to be the optimized delay capacitance path corresponding to the first specific step size.

26. The delay capacitance adjustment apparatus of claim 22, wherein the candidate delay capacitance path generation unit further selects a plurality of second delay capacitance paths from the plurality of delay capacitance paths to be a plurality of second candidate delay capacitance paths according to a second specific selecting direction, a second specific step size, magnitude ordering of delay capacitance of the plurality of delay capacitance paths and the optimized delay capacitance path corresponding to the first specific step size, wherein the second specific step size is smaller than the first specific step size, and the second specific selecting direction is the same as the first specific selecting direction or different from the first specific selecting direction; the echo power computation unit further computes a plurality of second delay capacitance path echo powers induced by the respective plurality of second candidate delay capacitance paths; the comparison unit further compares the plurality of second delay capacitance path echo powers to generate a second comparison result; and the determination unit further determines whether an optimized delay capacitance path corresponding to the second specific step size is one of the plurality of second candidate delay capacitance paths according to the second comparison result; wherein the optimized delay capacitance path of the communication device is determined according to the optimized delay capacitance path corresponding to the second specific step size.

27. The delay capacitance adjustment apparatus of claim 24, wherein when the second comparison result indicates that the optimized delay capacitance path corresponding to the second specific step size does not exist within the plurality of second candidate delay capacitance paths, the control unit further selects a plurality of third delay capacitance paths from the plurality of delay capacitance paths to update the plurality of second candidate delay capacitance paths according to the plurality of second delay capacitance paths, the second specific selecting direction, the second specific step size and the magnitude ordering of the delay capacitance of the plurality of delay capacitance paths.

28. The delay capacitance adjustment apparatus of claim 26, wherein when the second comparison result indicates that a minimum delay capacitance path echo power of the plurality of second delay capacitance paths echo powers does not correspond to a second candidate delay capacitance path having the maximum or minimum delay capacitance compared to the rest of the plurality of second candidate delay capacitance paths, the determination unit determines a second candidate delay capacitance path of the plurality of second candidate delay capacitance paths corresponding to the minimum delay capacitance path echo power to be the optimized delay capacitance path corresponding to the second specific step size.

\* \* \* \* \*